(12) United States Patent
Khanna

(10) Patent No.: US 6,944,040 B1
(45) Date of Patent: Sep. 13, 2005

(54) PROGRAMMABLE DELAY CIRCUIT WITHIN A CONTENT ADDRESSABLE MEMORY

(75) Inventor: Sandeep Khanna, Santa Clara, CA (US)

(73) Assignee: NetLogic Microsystems, Inc., Mountain View, CA (US)

( * ) Notice: Subject to any disclaimer, the term of this patent is extended or adjusted under 35 U.S.C. 154(b) by 0 days.

(21) Appl. No.: 10/938,028

(22) Filed: Sep. 10, 2004

Related U.S. Application Data

(62) Division of application No. 10/644,454, filed on Aug. 19, 2003, now Pat. No. 6,865,121, which is a division of application No. 10/040,714, filed on Dec. 28, 2001, now Pat. No. 6,650,575.

(51) Int. Cl.$^7$ .............................................. G11C 15/00
(52) U.S. Cl. ................... 365/49; 365/233; 365/189.02; 365/189.05; 365/194
(58) Field of Search .......................... 365/49, 194, 164, 365/189.02, 189.05, 233

(56) References Cited

U.S. PATENT DOCUMENTS

| | | |
|---|---|---|
| 4,887,279 A | 12/1989 | Odenheimer |
| 5,146,592 A | 9/1992 | Pfeiffer et al. |
| 5,260,888 A | 11/1993 | Sharman |
| 5,448,193 A | 9/1995 | Baumert et al. |
| 5,504,870 A | 4/1996 | Mori et al. |
| 5,528,186 A | 6/1996 | Imamura |
| 5,790,838 A | 8/1998 | Irish et al. |
| 5,811,985 A | 9/1998 | Trimberger et al. |
| 5,857,095 A | 1/1999 | Jeddeloh et al. |
| 5,877,714 A | 3/1999 | Satoh |
| 5,892,981 A | 4/1999 | Wiggers |
| 6,031,401 A | 2/2000 | Dasgupta |
| 6,097,724 A | 8/2000 | Kartalopoulos |
| 6,101,137 A | 8/2000 | Roh |
| 6,111,812 A | 8/2000 | Gans et al. |
| 6,125,217 A | 9/2000 | Paniccia et al. |
| 6,127,865 A | 10/2000 | Jefferson |
| 6,130,552 A | 10/2000 | Jefferson et al. |
| 6,140,854 A | 10/2000 | Coddington et al. |
| 6,163,502 A | 12/2000 | Wong et al. |
| 6,181,174 B1 | 1/2001 | Fujieda et al. |
| 6,205,083 B1 | 3/2001 | Foss et al. |
| 6,212,246 B1 | 4/2001 | Hendrickson |
| 6,218,864 B1 | 4/2001 | Young et al. |
| 6,242,955 B1 | 6/2001 | Shen et al. |
| 6,253,346 B1 | 6/2001 | Kim et al. |
| 6,259,467 B1 | 7/2001 | Hanna |
| 6,271,681 B1 | 8/2001 | Cliff et al. |
| 6,275,555 B1 | 8/2001 | Song |
| 6,286,118 B1 | 9/2001 | Churchill et al. |
| 6,294,938 B1 | 9/2001 | Coddington et al. |
| 6,326,812 B1 | 12/2001 | Jefferson |
| 6,369,624 B1 | 4/2002 | Wang et al. |
| 6,459,652 B1 | 10/2002 | Lee et al. |
| 6,463,109 B1 | 10/2002 | McCormack et al. |
| 6,480,557 B1 | 11/2002 | Rog et al. |
| 6,785,152 B2 | 8/2004 | Yiu et al. |

(Continued)

*Primary Examiner*—Hoai Ho
*Assistant Examiner*—Ly Duy Pham
(74) *Attorney, Agent, or Firm*—Shemwell Gregory & Courtney LLP

(57) ABSTRACT

An apparatus having an output register coupled to a content addressable memory (CAM) array. The output register may be configured to output data based on a delayed clock signal. A programmable delay circuit may be coupled to receive a reference clock signal and generate the delayed clock signal using one or more delay elements.

18 Claims, 13 Drawing Sheets

U.S. PATENT DOCUMENTS

| | | |
|---|---|---|
| 2001/0050585 A1 | 12/2001 | Carr |
| 2003/0081491 A1 | 5/2003 | Mlki |
| 2003/0107944 A1 | 6/2003 | Foss et al. |
| 2003/0208717 A1 | 11/2003 | Klotchkov et al. |
| 2004/0004902 A1 | 1/2004 | Okuda et al. |
| 2005/0017775 A1 * | 1/2005 | Starr .......................... 327/156 |
| 2005/0034006 A1 * | 2/2005 | Schoenfeld et al. ......... 713/401 |

* cited by examiner

| REFERENCE CLOCK SIGNAL FREQUENCY RANGE | PROGRAMMABLE REGISTER BIT VALUES | DELAY ELEMENT | DELAY VALUE |
|---|---|---|---|
| 200 MHZ | 0 0 0 0 | $D_{2^n-1}$ | 3ns |
| 250 MHZ | 0 0 0 1 | $D_{2^n-2}$ | 2ns |
| 333 MHZ | 0 0 1 0 | $D_{2^n-3}$ | 1ns |
| ⋮ | ⋮ | ⋮ | ⋮ |
| 400 MHZ | 1 1 1 1 | — | 0ns |

FIG. 8

PROGRAMMABLE DELAY CIRCUIT WITHIN A CONTENT ADDRESSABLE MEMORY

REFERENCE TO RELATED APPLICATION

This application is a divisional of application Ser. No. 10/644,454, now U.S. Pat. No. 6,865,121 filed Aug. 19, 2003, which is a divisional of application Ser. No. 10/040,714, filed Dec. 28, 2001, now U.S. Pat. No. 6,650,575.

TECHNICAL FIELD

This invention relates to the field of memory devices and, in particular, to content addressable memory devices.

BACKGROUND

One issue facing memory device designers today is the problem associated with a clock signal being distributed throughout the integrated memory circuit die while maintaining minimal clock skew. Clock signals are used to control the times at which component operations occur in a digital circuit. Clock skew is the time difference between clock signal edges arriving at different areas (e.g., different components) of an integrated circuit. Minimizing clock skew is important because digital logic circuits within memory devices require precise clocking for proper operation of the entire device (e.g., the outputting of data). Ideally, synchronous memory devices should have clock signals arriving simultaneously to all circuit components within the device that operate on the same clock period and same clock edge. In practice, the delay through a clock signal path should not be more than the interval between one of the edges of the clock signal and a following edge of the clock signal. As such, if there is a substantial amount of clock skew within a device, some components may not receive an edge of a clock signal before other components receive a subsequent edge based on the frequency of the clock signal. This prevents some components from operating at designated times relative to other components, and can cause the device to malfunction. As such, clock skew may limit the maximum clock frequency that a device may operate at because the device needs to be designed to accommodate worst case clock skew and still operate properly.

One of the causes of clock skew within an integrated circuit is that the impedance, or resistance-capacitance (RC), of the traces that route the clock signal to different areas of the device generate a delay in the clock signal. Other contributors to clock skew are delays due to passing the clock signal through pads and input buffers and the loading of the various registers that are driven by the clock signal, as illustrated in FIG. 1A. The total clock signal input to data output ($D_{out}$) delay ($T_{CD}$) for the exemplary path illustrated in FIG. 1A is equal to the input buffer delay+the clock (CLK) buffer delay+RC delay of the metal trace+output register delay+the output buffer delay. Some exemplary values of the various delays may be 0.5 nanoseconds (ns) for the input buffer delay, 0.5 ns for the clock buffer delay, 1.5 ns for the trace delay, 0.5 ns for the output register delay, and 1.5 ns for the output buffer delay resulting in a $T_{CD}$ of 4.5 ns.

The $D_{out}$ of the memory integrated circuit may be provided to other components (e.g., component B) that are connected with the memory integrated circuit on one or more printed circuit boards (PCB), as illustrated in FIG. 1B. The memory integrated circuit and component B may both be timed to operate based on the same clock signal. However, components typically require a set-up time (Tsu) in order to operate properly. The setup time is the minimum time needed for $D_{out}$ to be applied at the input of component B before component B is triggered by the clock signal to perform a designated operation. An exemplary setup time may be approximately 2 ns. As such, component B would need to receive $D_{out}$ from the memory circuit at least 2 ns before a subsequent clock edge of the clock signal that triggers component B to perform its operation. Continuing the example above, if the memory integrated circuit has a $T_{CD}$ of 4.5 ns (e.g., in a read operation of the memory array), then $D_{out}$ would be provided to component B after approximately 4.5 ns. If the clock signal has a frequency of, for example, 100 MHz (i.e., the time period between clock signal edges is 10 ns), then there would be sufficient time (10 ns−4.5 ns=5.5 ns) to allow for the setup (2 ns) of component B with the clock skew of 4.5 ns. However, if the frequency of the clock signal is increased to 200 MHz, as illustrated in FIG. 1C, then the time period between triggering clock edges is 5 ns. With a $T_{CD}$ of 4.5 ns, then $D_{out}$ would not be provided to component B in enough time (short by a delta of 1.5 ns) to allow for the 2 ns setup time for component B before a subsequent edge of the 200 MHz clock signal triggers component B to operate using $D_{out}$. Thus, a subsequent clock edge would be used to clock component B. This will decrease the overall throughput of the system incorporating components A and B. With devices operating at increasing frequencies, clock skew poses an increasing problem. Moreover, as the level of integration in a memory device increases, clock skew due to the above noted contributing factors becomes even greater.

FIG. 2A illustrates prior art solutions to clock skew in synchronous random access memory (SRAM) devices. One solution is to utilize a phase locked loop (PLL) to generate an internal clock signal that is synchronized with the original reference clock signal and then use the internal clock signal to drive output registers of the SRAM. A typical PLL contains a voltage controller oscillator (VCO) to generate the internal clock signal having a fixed amount of delay with respect to the reference clock signal. The PLL also contains a phase detector to measure the phase difference between the reference clock signal and the internal clock signal. The measured difference drives a charge pump to raise and lower the voltage level of a loop filter. The loop filter provides a stable voltage input to the VCO. Because the frequency of reference clock signal may vary over time, these differences are provided back to the phase detector and used to lock the frequency of the internal clock signal to the reference clock signal. If, for example, the frequency of the reference clock signal shifts slightly, the phase difference between the VCO signal and reference clock signal will begin to increase with time. This changes the control voltage on the VCO in such a way as to bring the VCO frequency of the internal clock signal back to the value of the reference clock signal. Thus, the loop maintains lock when the reference clock signal frequency varies.

The resulting internal clock signal is phase shifted from the reference clock signal such that both clock signals have the same frequency but the triggering edges of the internal clock signal is delayed with respect to the triggering edges of the reference clock signal. The internal clock signal is generated during power-up of the SRAM before any circuit operations are performed. As such, although the internal clock signal is delayed from the reference clock signal, the output registers may trigger off of a later clock edge of the free running internal clock signal that exists earlier in time than the skewed reference clock signal edge, as illustrated in FIG. 2B. In this manner, the clock signal input to data output delay associated with the path illustrated in FIG. 1A is reduced.

For high speed designs running at clock frequencies greater than, for example, 200 megahertz (MHz) (cycle time of 5 ns), $T_{CD}$ parameter may need to be very small (e.g., on the order of 1–2 ns). One solution for minimizing this parameter is the use a delay locked loop (DLL) to synchronize an internally generated clock signal with the reference clock signal and use the internal clock signal to drive output registers of the SRAM. A typical DLL includes a phase detector that measures the phase difference between the reference clock signal and the internally generated clock signal. The phase detector drives a shift register that causes stored data to shift positions based on the difference in signals. The shift register is coupled to a delay line to produce a phase-adjusted clock signal by sequentially delaying the internal clock signal according to the shift register data. The internal clock signal is fed back to the phase detector for comparison with the reference clock signal. As with the PLL, when the reference clock signal and the internal clock signal are the same, the DLL is locked onto the reference clock signal. As such, a feedback relationship is used to generate and maintain the internal clock signal with both the PLL and the DLL.

One problem with using a PLL is that the phase detector, loop filter, and VCO are typically analog components that have poor stability and performance in noisy digital switching environments. Similar problems may exist with the components used in a DLL. As such, it may not be desirable to use a PLL or DLL in content addressable memory devices that are typically more noisy than SRAM devices due to simultaneously comparing data with many CAM cells in the CAM array. In addition, the analog components used in a PLL/DLL utilize separate power and ground supplies that typically use higher voltages (e.g., 2.5V–3.5V) than digital components (e.g., 1.2V). Moreover, PLL and DLL components may only be able to operate in a fixed frequency range, thereby limiting their versatility.

BRIEF DESCRIPTION OF THE DRAWINGS

The present invention is illustrated by way of example and not intended to be limited by the figures of the accompanying drawings.

FIG. 8 is an exemplary table of the programming values for selecting a particular delay element based on the frequency of a reference clock signal.

DETAILED DESCRIPTION

Figure 1A:
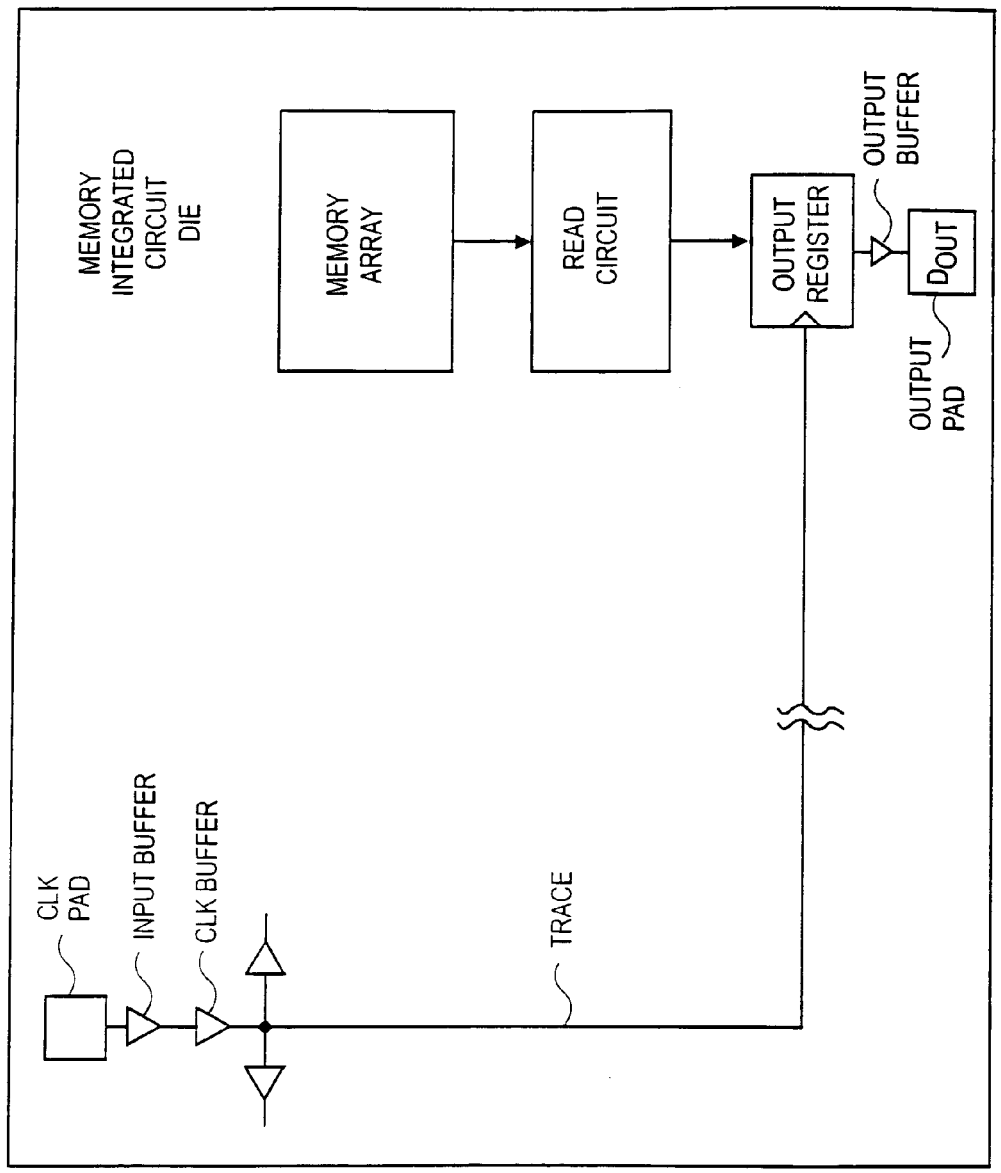
FIG. 1A illustrates exemplary components contributing to clock skew in an integrated circuit.
Figure 1B:
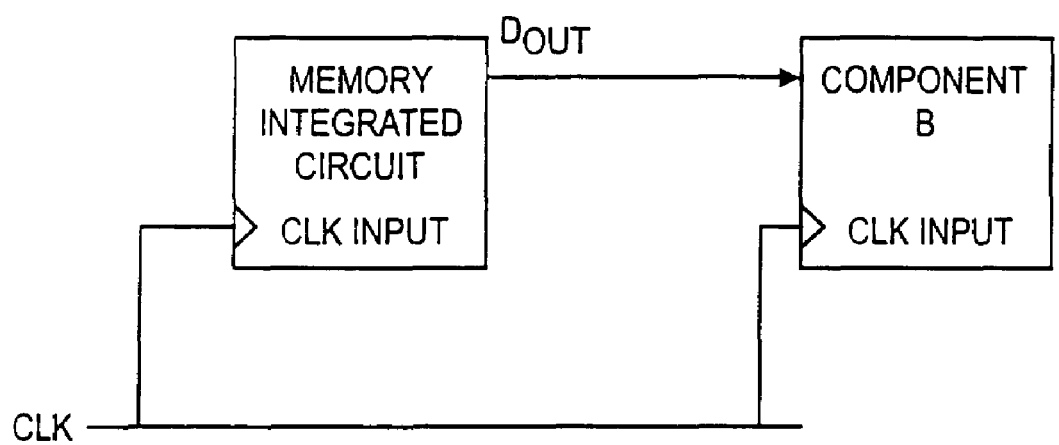
FIG. 1B illustrates an exemplary system having components configured to operate with a common clock signal.
Figure 1C:
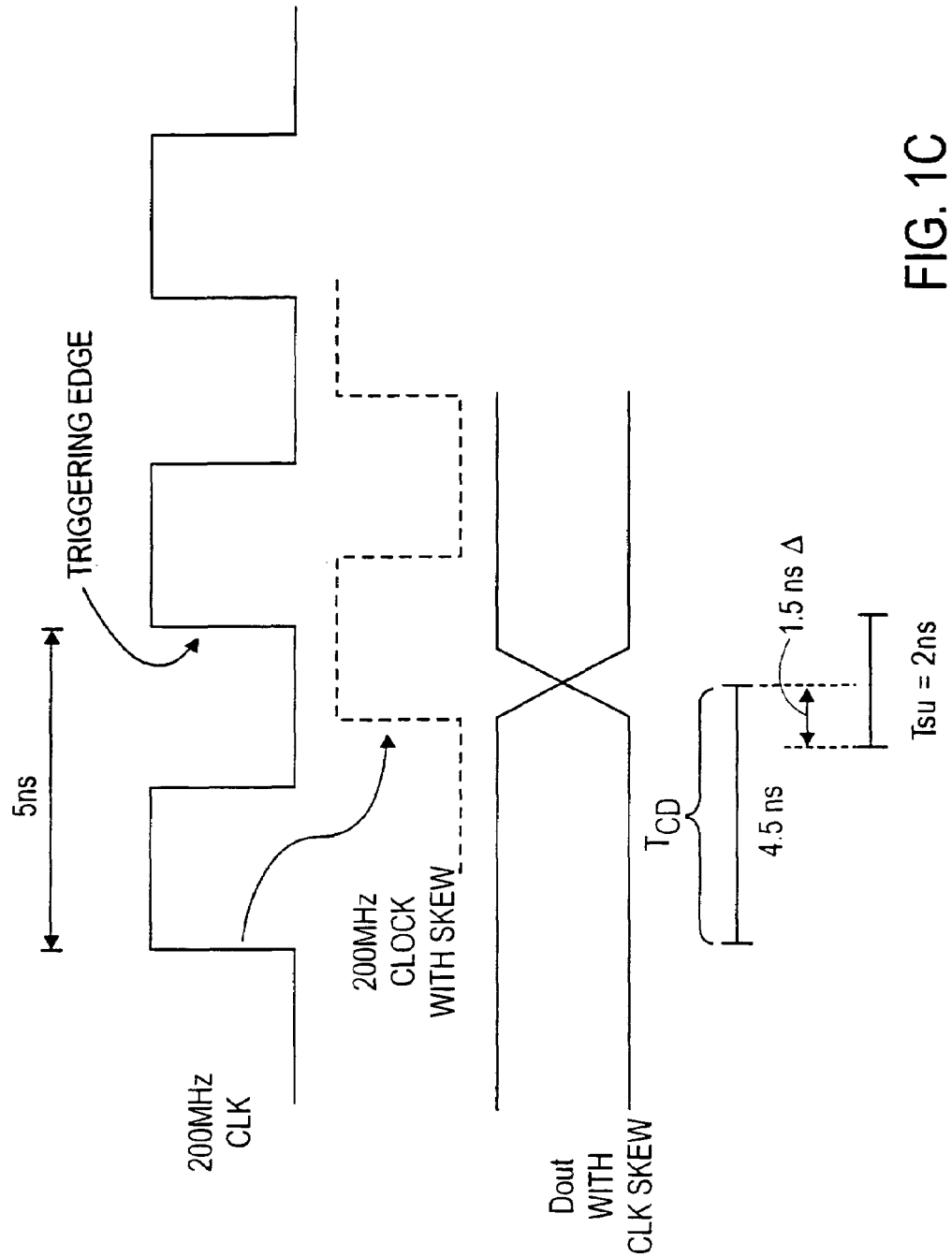
FIG. 1C is a timing diagram illustrating an exemplary operation of the system of FIG. 1B.
Figure 2A:
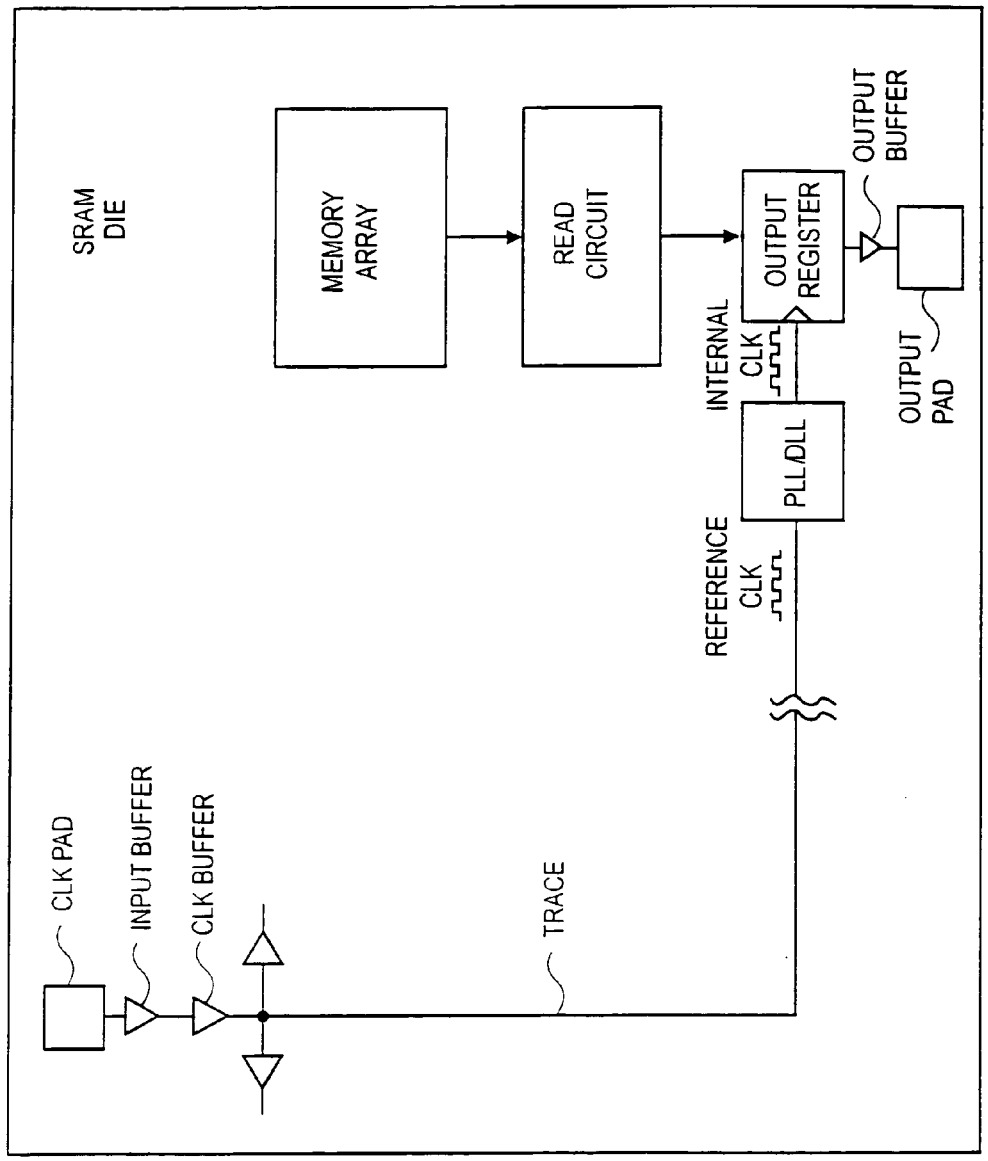
FIG. 2A illustrates a prior art SRAM with a PLL/DLL.
Figure 2B:
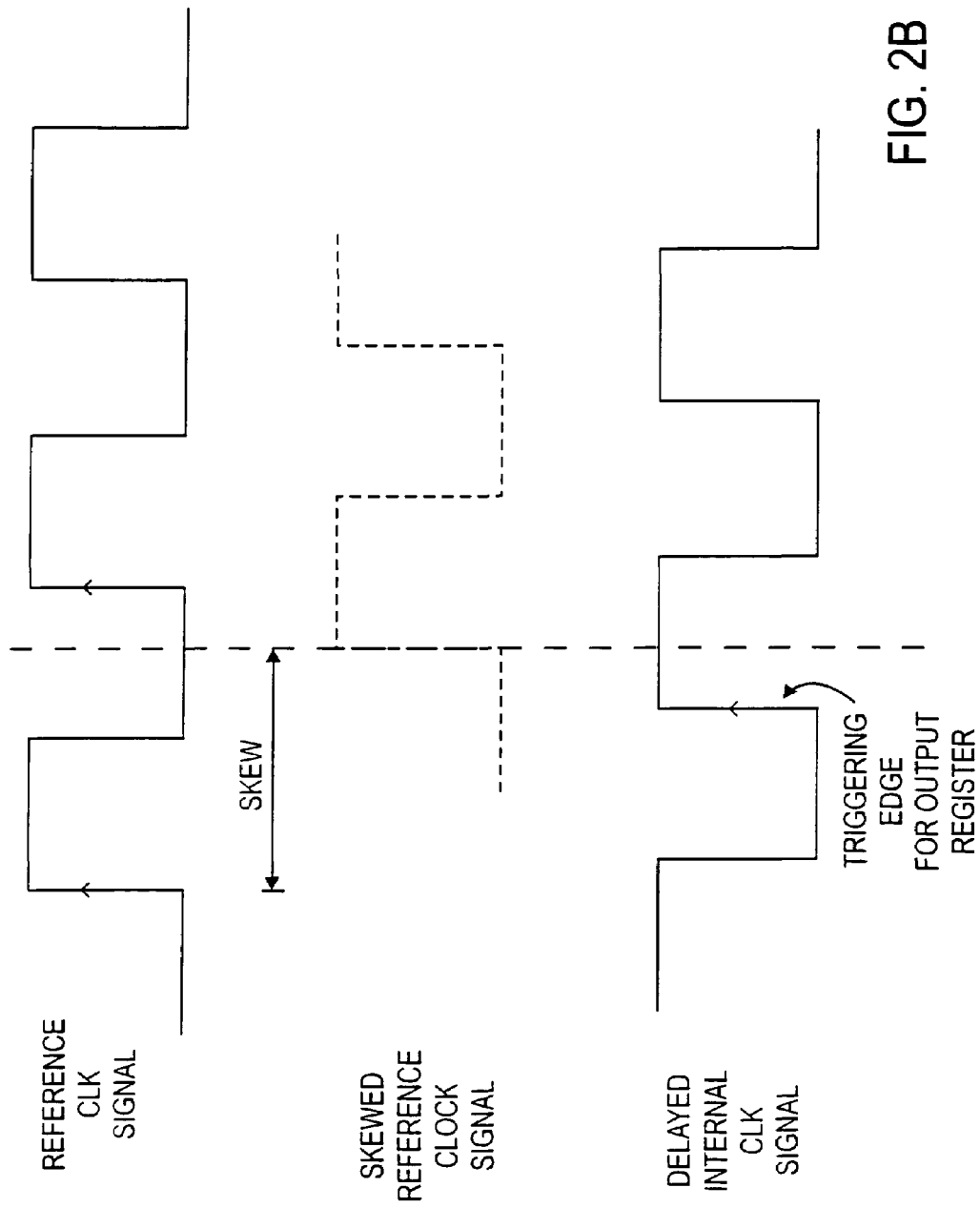
FIG. 2B is a timing diagram illustrating the relationship between clock signals.

In the following description, numerous specific details are set forth such as examples of specific, components, circuits, delays, etc. in order to provide a thorough understanding of the present invention. It will be apparent, however, to one skilled in the art that these specific details need not be employed to practice the present invention. In other instances, well known components or methods have not been described in detail in order to avoid unnecessarily obscuring the present invention.

The term "coupled" as used herein means connected directly to or indirectly connected through one or more intervening components or circuits. Additionally, the interconnection between components, circuits, blocks, etc., may be shown as buses or a single signal lines. Each of the buses may alternatively be a single signal line and each of the single signal lines may alternatively be buses.

Embodiments of the present invention include various method steps, which will be described below. The steps may be performed by hardware components or may be embodied in machine-executable instructions, which may be used to cause hardware components (e.g., a processor, programming circuit) programmed with the instructions to perform the steps. Alternatively, the steps may be performed by a combination of hardware and software.

Embodiments of the present invention may be provided as a computer program product, or software, that may include a machine-readable medium having stored thereon instructions. The machine readable medium may be used to program a computer system (or other electronic devices) to generate articles (e.g., wafer masks) used to manufacture embodiments of the present invention. The machine-readable medium may include, but is not limited to, floppy diskettes, optical disks, CD-ROMs, and magneto-optical disks, ROMs, RAMs, EPROMs, EEPROMs, magnet or optical cards, flash memory, or other type of media/machine-readable medium suitable for storing electronic instructions.

The machine readable medium may store data representing an integrated circuit design layout that includes embodiments of the present invention. The design layout for the integrated circuit die may be generated using various means, for examples, schematics, text files, gate-level netlists, hardware description languages, layout files, etc. The design layout may be converted into mask layers for fabrication of wafers containing one or more integrated circuit dies. The integrated circuit dies may then be assembled into packaged components. Design layout, mask layer generation, and the fabrication and packaging of integrated circuit dies are known in the art; accordingly, a detailed discussion is not provided.

The method and apparatus described herein provides for a programmable delay circuit to compensate for reference clock signal skew in integrated circuits such as a content addressable memory (CAM). In one embodiment, the apparatus includes a programmable delay circuit coupled between a clock pad and an output register. The programmable delay circuit includes a programmable register and a delay selection circuit. The delay selection circuit includes a plurality of delay elements coupled to a multiplexer. The programmable register is coupled with the first multiplexer. In one embodiment, a user may program the programmable register during device initialization with time period information for delaying a reference clock signal received at the clock pad. During device operation, the time period information is decoded and transmitted to the multiplexer to select from among delayed clock signals generated by the plurality of delay elements. The selected delayed clock signal is provided to clock the data output from the output register.

In another embodiment, the apparatus may also include a second programmable delay circuit coupled between the clock pad and the output register. The second programmable delay circuit may be used to fine tune the desired delay for the internal clock signal clocking the output register. The desired delay may be fine tuned, for example, based on a particular frequency of operation of the reference clock signal. The second programmable delay circuit may be coupled to its own programmable register to receive the fine tuning time period information to select among a plurality of delayed clock signals generated by a plurality of delay elements in the second programmable delay circuit. Alternatively, different bit positions of the same programmable register may be coupled to the first and second delay selection circuits.

The use of programmable delay circuits as discussed above may enable integrated circuits and, in particular, CAM devices to operate at higher frequencies than would otherwise be possible. By using a programmable register to select from among clock signals that are phase shifted by delay elements, a delayed internal clock signal, relative to a reference clock signal, may be generated without the use of feedback circuit as with prior art solutions. This may provide for the generation of a more precise delayed internal clock signal across various frequencies of operation of the reference clock signal.

The programmable delay circuits discussed herein may be particularly useful in CAM devices that may typically be noisier than other types of memory devices such as an SRAM. For example, during a compare operation, the entire CAM array may be active, thereby generating a large amount of current switching that would have an adverse effect on a PLL or DLL if they were operated with the same power supplies as the CAM array. Although separate power supplies may be used for a PLL/DLL and other components within a device, such separation would require extensive design work and die area in order to implement, which may not be feasible. Additionally, shielding a PLL or DLL from the substrate noise generated by the simultaneous switching of the CAM circuits can be difficult. Moreover, the programmable delay circuits discussed herein may use the same power supply as the CAM array and this will enable the programmable delay circuit to scale in operating voltage with the CAM array as fabrication processes scale to smaller and smaller geometries.

The programmable delay circuits discussed herein also are not limited to a particular operating frequency range, thus increasing the applications in which the programmable delay circuits may be used.

Figure 3:
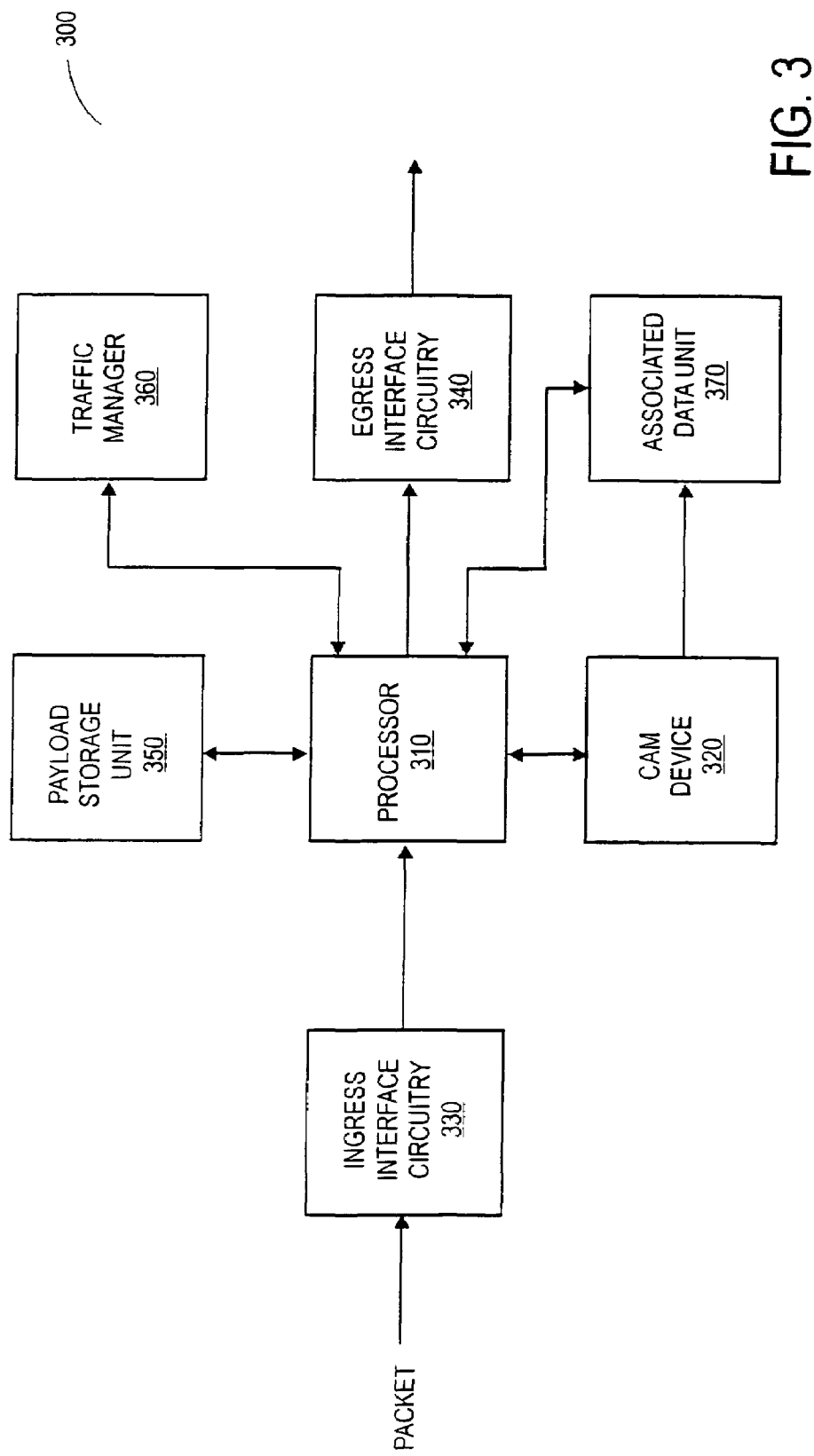
FIG. 3 illustrates one embodiment of a line card or blade of a router having a CAM device configured to perform concurrent lookups.

FIG. 3 illustrates one embodiment of a line card or blade of a router including a CAM device having a programmable delay circuit. Line card 300 includes processor 310, ingress interface circuitry 330, egress interface circuitry 340, CAM device 320, associated data storage unit 370, traffic manager 360, and payload storage unit 350.

Processor 310 functions to control the overall operation of line card 300 in cooperation with the other components of line card 300. For example, processor 310 receives packets from a network medium through ingress interface circuitry 330, stores the payload of packets in payload storage unit 350, and processes packet header information to determine required lookups in CAM device 320 and subsequent handling of the packets, as discussed herein. Ingress circuitry includes, for example, PHY and MAC devices. Processor 310 sends out packets on a network medium through egress interface circuitry 340 based on the lookups performed by CAM device 320. Egress interface circuitry 340 may be connected to a switch fabric or directly to one or more other routers or switches. Processor 310 may be one or more network processor units (NPUs), microprocessors, or one or more special purpose processors such as a digital signal processor (DSP). In another embodiment, processor 310 may be another type of controller, for example, a field programmable gate array or a general purpose processor. The processor 310, ingress interface circuitry 330, and egress interface circuitry 340 components of a router are known in the art; accordingly, a detailed discussion is not provided.

In response to information in a packet header, for a particular packet, processor 310 determines the number and types of lookups to be performed by one or more of CAM devices 320, and forms the search keys for these lookups. The searches or lookups may include, for example, Classification lookups, forwarding lookups (e.g., Next Hop or longest prefix match (LPM) lookup), MAC lookup, MPLS lookup, etc. For one example, when multiple searches are required, processor 310 forms a composite search key that includes at least two, and as many as all, of the various search keys for the lookups. The composite search key may be provided as a common input string to CAM device 320. For one embodiment, CAM device 320 selectively identifies and extracts the individual search keys from the input string and provides the individual search keys to the associated CAM blocks to perform the lookups. Advantageously, the lookups can then occur concurrently or simultaneously in the CAM blocks of CAM device 320, thereby increasing overall throughput over conventional systems in which searches are processed sequentially.

CAM device 320 may be a multiple block CAM device with each block capable of storing a different table for comparand lookups. Alternatively, CAM device 320 may represent multiple, single block CAM devices (e.g., with each single block CAM device formed on a different integrated circuit substrate) with each CAM device used to store a different table for comparand lookup. After one or more lookups are executed in CAM device 320, associated information for matching entries (e.g., additional routing information and/or packet information) may be retrieved from associated data unit 370. Processor 310 then communicates with traffic manager 360 to schedule the exit of a packet from line card 300 via egress interface circuitry 340.

Figure 4:
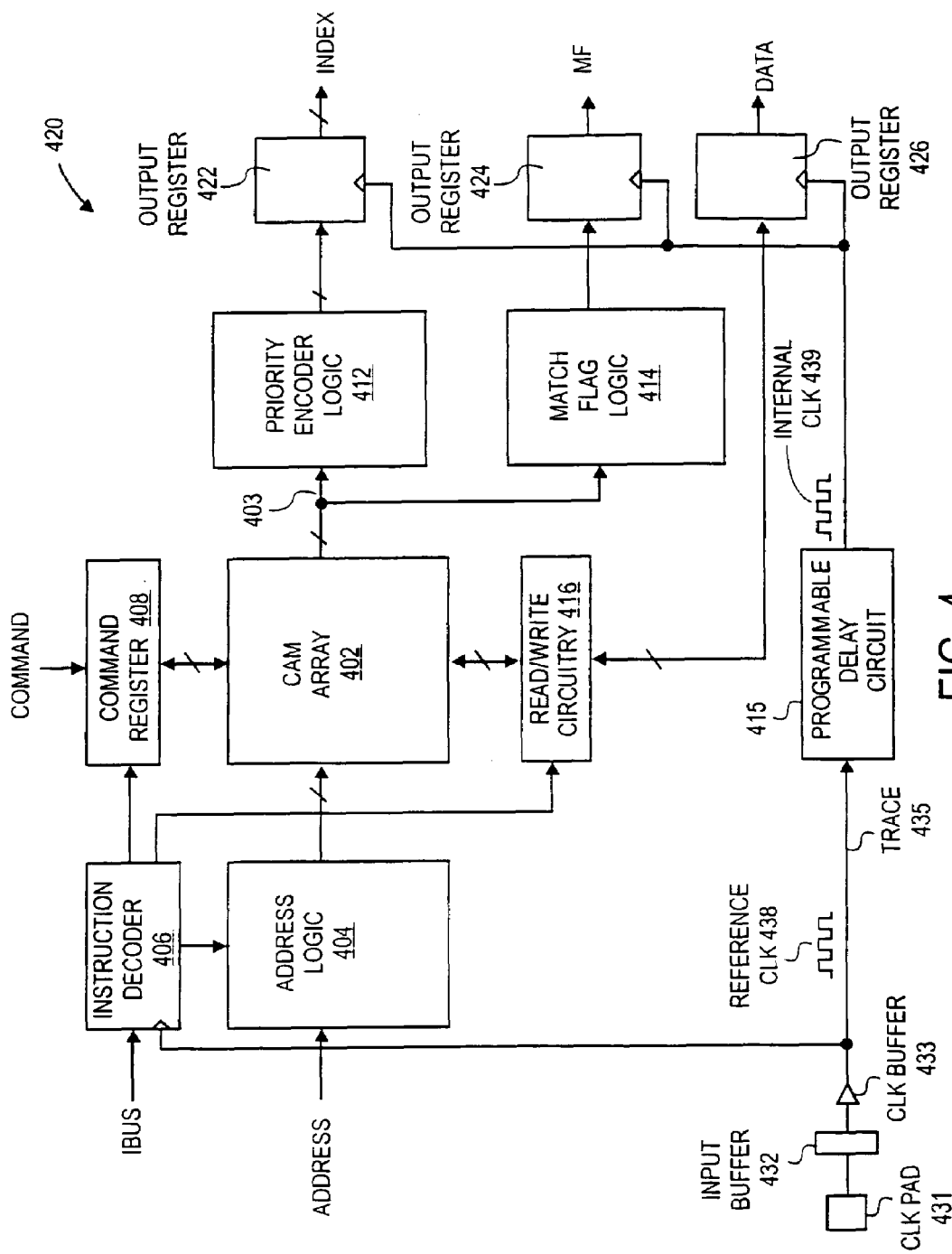
FIG. 4 illustrates one embodiment of a CAM device having a programmable delay circuit.

FIG. 4 illustrates one embodiment of a CAM device having a programmable delay circuit. In one embodiment, CAM device 420 may be the CAM device 320 of FIG. 3. CAM device 420 includes instruction decoder 406, comparand register 408, address logic 404, CAM array 402, priority encoder logic 412, read/write circuitry 416, match flag logic 414, programmable delay circuit 415, clock pad 431, input buffer 432, and output registers 422, 424, and 426.

CAM array 402 includes CAM cells that may be of any type of CAM cells, including NAND and NOR based binary, ternary or other CAM cells, that may be formed from either volatile or non-volatile elements and include at least one storage element and one compare circuit. CAM device 420 may be instructed, for example, by processor 310 of FIG. 3 to compare a search key, also referred to as a comparand (e.g., packet header data), with data stored in its associative memory array 402. Multiple entries in the CAM array are simultaneously compared with all, or a portion, of the search key to identify matching entries.

Instruction decoder 406 decodes various instructions provided on instruction bus IBUS. The instructions may include instructions to write data to CAM array 402, read data from CAM array 402, and to compare comparand data with data stored in the CAM array 402. The comparand data may be provided on comparand bus CBUS and stored in comparand register 408 or directly provided to CAM array 402. The CAM device 420 may also include one or more global mask registers (not shown) for the comparand data provided to CAM array 402.

Data is written to CAM array 402 by read/write circuitry 416 and address logic 404. Address logic 404 selects one or more rows of CAM cells in response to an address. The write data is provided to the selected cells (e.g., over one or more data bit lines) by the write portion of read/write circuitry 416 (e.g., write buffers). Data is read from one or more selected rows of CAM cells by the read portion of read/write circuitry 416 (e.g., by a sense amplifier).

Instruction decoder receives a reference clock signal that may be generated externally from CAM device 420 and applied to clock pad 431. The reference clock signal may be received from, for example, processor 310 of FIG. 3. The instruction decoder 406 provides various control signals to address logic 404, read/write circuitry 416, and comparand register 408 to control when CAM device 420 performs one or more operations according to the timing of the reference clock signal. Additionally, instruction decoder 406 may provide one or more control signals to CAM array 402, priority encoder logic 412, match flag logic 414, programmable delay circuit 415 and/or output registers 422, 424, and 426 to enable these circuits to perform their associated functions at an appropriate time.

When CAM array 402 is searched for a match of the stored data with the key (comparand data), each matching location indicates a match on one of match lines 403. Match flag logic 414 indicates the existence of a match if at least one of the match lines 403 carries a match signal indicating a match. Additional flag logic such as almost full flag logic, full flag logic, and/or multiple match flag logic may also be included in CAM device 420.

Priority encoder logic 412 translates a matched location(s) into an index (or a match address) and outputs this index to output register 422 (which may be accessed by processor 310 of FIG. 3). Priority encoder logic 412 also identifies which matching location has the top priority if there is more than one matching entry.

CAM device 420 also includes a programmable delay circuit 415 coupled between CLK pad 431 and the output registers 422, 424, and 426. Programmable delay circuit 415 generates an internal clock signal 439 that is delayed from reference clock signal 438 and is used to time the output of information stored in output registers 422, 424, and 426. Programmable delay circuit 415 may be used to minimize the clock skew between the clock signal triggering, for example, instruction decoder 406 and the output registers 422, 424, and 426. For example, clock skew may result from CLK pad 431 delay, input buffer 432 delay, CLK buffer 433 delay, and the RC delay of the conductive trace 435, as well as, an output register delay and an output pad (not shown) delay. Without programmable delay circuit 415, the clock skew within CAM device 420 may result in the output registers not clocking out an index, match flag, or data to satisfy the setup time of a follow-on device using the same clock signal source as CAM device 420. As such, the use of programmable delay circuit 415 may enable CAM device 420 to operate at higher frequencies than would otherwise be possible. The operation of programmable delay circuit 415 is discussed in greater detail below.

It should be noted that in an alternate embodiment, CAM device 420 may have other configurations. For example, the CAM device 420 may include multiple match flag logic to assert a multiple match flag. For another example, instruction decoder 406 may be omitted and various read, write and compare control signals and the clock signal provided directly to one or more of the circuit blocks.

Programmable delay circuit 415 may be particularly useful in CAM device 420 since the CAM device 420 may be noisier than other types of memory devices due to simultaneously comparing data with many CAM cells in CAM array 402. Such a compare operation generates a large amount of current switching that would have less of an adverse affect on programmable delay circuit 415 than on a PLL/DLL if they were operated with the same power supply as CAM array 402. In addition, a lower voltage power supply may be used to power programmable delay circuit 415 than may otherwise be needed to power a PLL or DLL, and the voltage power supply for programmable delay circuit 415 may scale with that of other circuits, such as the CAM array, as fabrication processes scale to smaller and smaller geometries. Furthermore, programmable delay circuit 415 is not limited to a particular operating frequency range, thus increasing the applications in which programmable delay circuit 415 may be used.

Figure 5A:
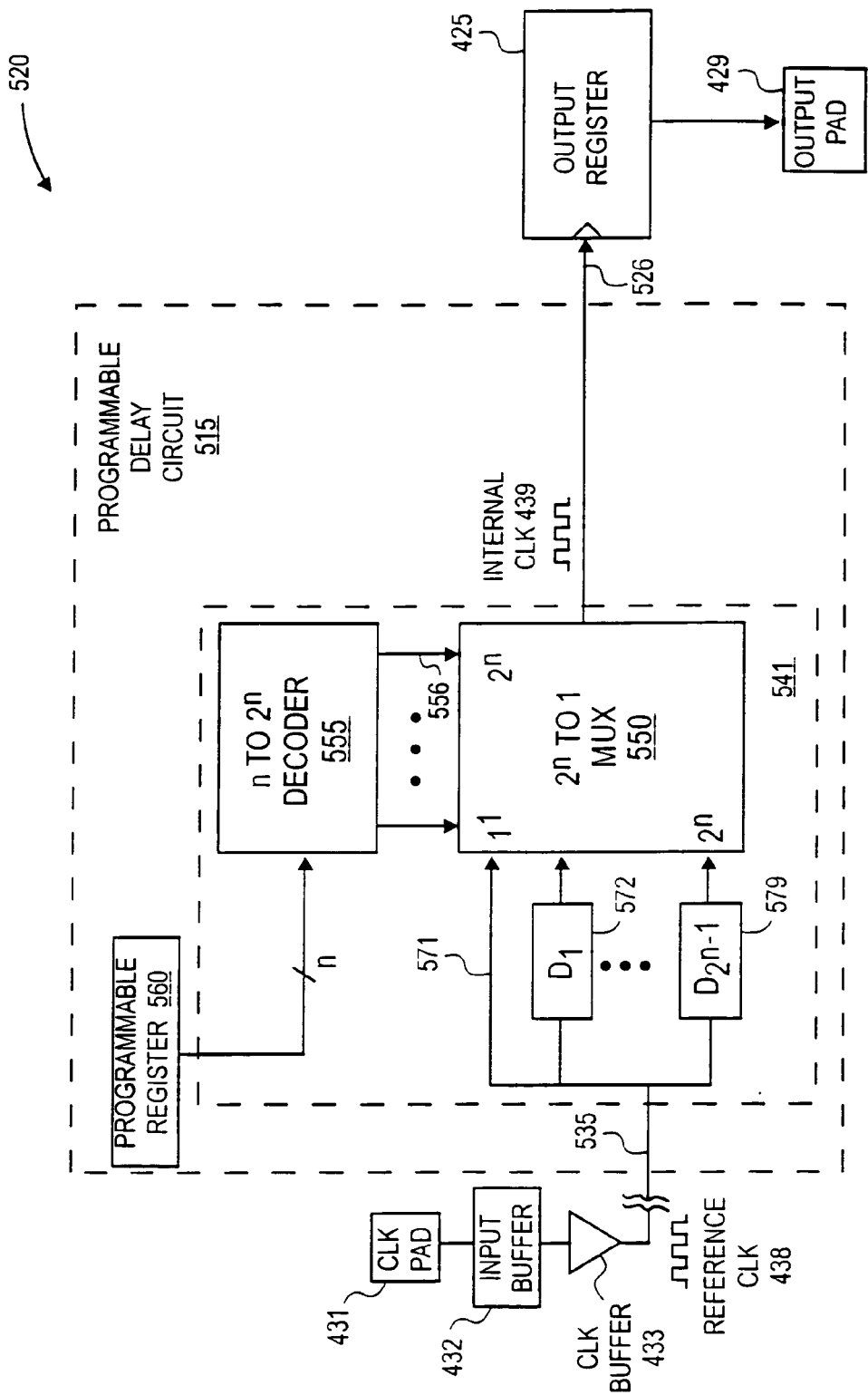
FIG. 5A illustrates one embodiment of a programmable delay circuit.

FIG. 5A illustrates programmable delay circuit 515 that is one embodiment of programmable delay circuit 415 of FIG. 4. Programmable delay circuit 515 may also be used in other types of integrated circuits, for example, another type of memory device such as an SRAM, DRAM and other volatile or non-volatile memories, as well as other integrated circuit devices for examples, a microprocessor, digital signal processor (DSP), application specific integrated circuit (ASIC) and programmable devices such as a field programmable gate array (FPGA) and a programmable logic device (PLD).

Figure 7:
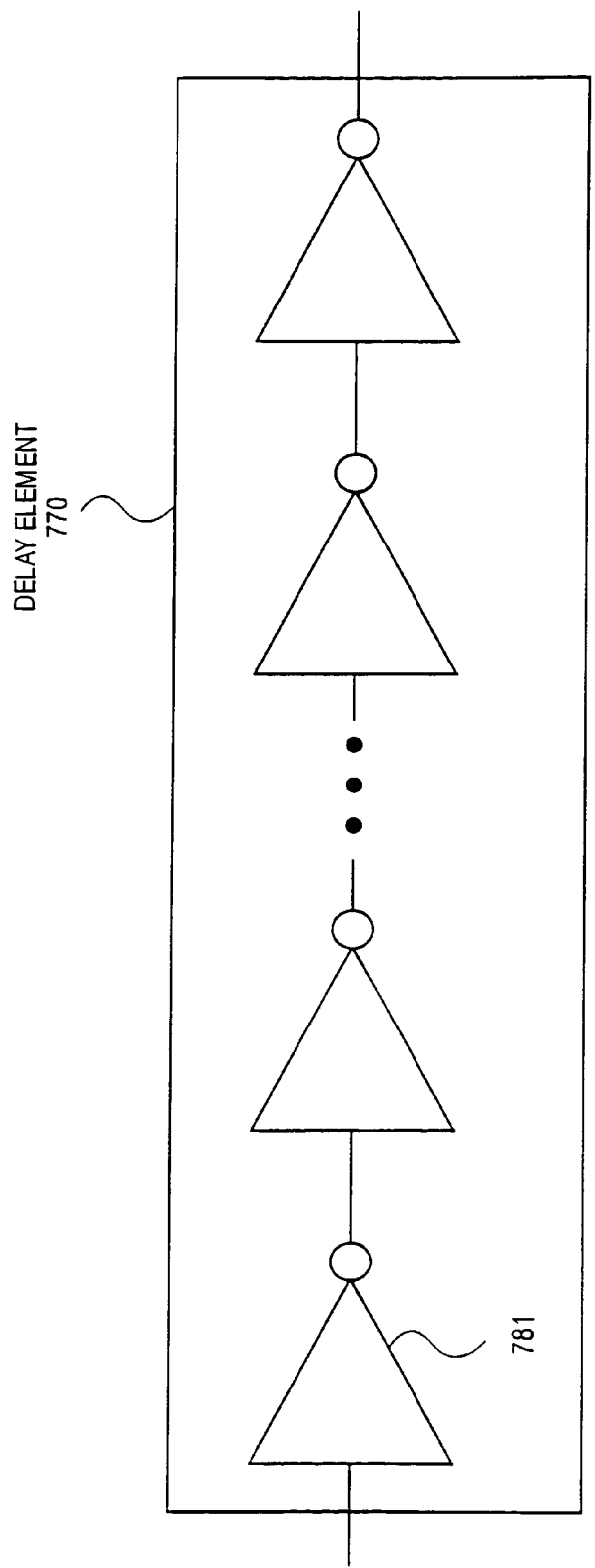
FIG. 7 illustrates one embodiment of a delay element used within a programmable delay circuit.

Programmable delay circuit 515 includes program register 560 and delay selection circuitry 541. Delay selection circuitry 541 includes decoder 555, multiplexer 550, and $2^n$ delay paths including delay path 571 and $2^n-1$ delay paths including delay elements 572–579 to delay the reference clock signal 438 by different time periods. More or less delay elements may also be used. In one embodiment, for example, a delay element may be a series of one or more inverters (e.g., inverter 781) as illustrated by delay element 770 of FIG. 7. Alternatively, other types of delay elements may be used, for examples, buffers and RC network components. Programmable delay circuit 515 also includes a delay path 571 that is limited only by the intrinsic impedance of the conductive trace of the path.

Each of delay elements 572–579 are coupled to receive CLK reference signal 438 and generate a correspondingly delayed internal clock signal that is output to multiplexer 550. Each of delay elements 572–579 may provide a different time period delay. For example, delay element 571 represents a direct connection between reference clock signal 438 and multiplexer 550 (i.e., no delay element). Delay element $D_1$ 572 represents a predetermined amount of time period delay greater than zero and delay element 579 represents the greatest amount of time period delay.

The internal clock signals generated by the delay elements have the same frequency as reference clock signal 438 but are phase shifted relative to reference clock signal 438.

Multiplexer 550 operates to select from among the outputs of the delay elements under the control of programmable register 560. Multiplexer 550 transmits the selected internal clock signal 439 to a clocking input 526 of output register 422. Programmable register 560 is coupled to decoder 555 that, in turn, is coupled to multiplexer 550. Programmable register 560 is an n-bit register that stores information that is used to determine which output of delay elements 571–579 is to be selected by multiplexer 550. For other embodiments, programmable register 560 may have a different number of bits. Decoder 555 decodes the information stored in programmable register 560 and generates control signals that are transmitted (e.g., via signal line(s) 556) to multiplexer 550 for selecting one of the outputs of the delay elements 571–579 based on the information stored in the programmable register 560. It should be noted that although decoder 555 is illustrated separately from multiplexer 550, the operations of decoder 560 may be incorporated into multiplexer 550 or performed by a separate circuit. Similarly the operations of other illustrated components of the figures may be performed by separate circuits or incorporated within other circuits.

Figure 5B:
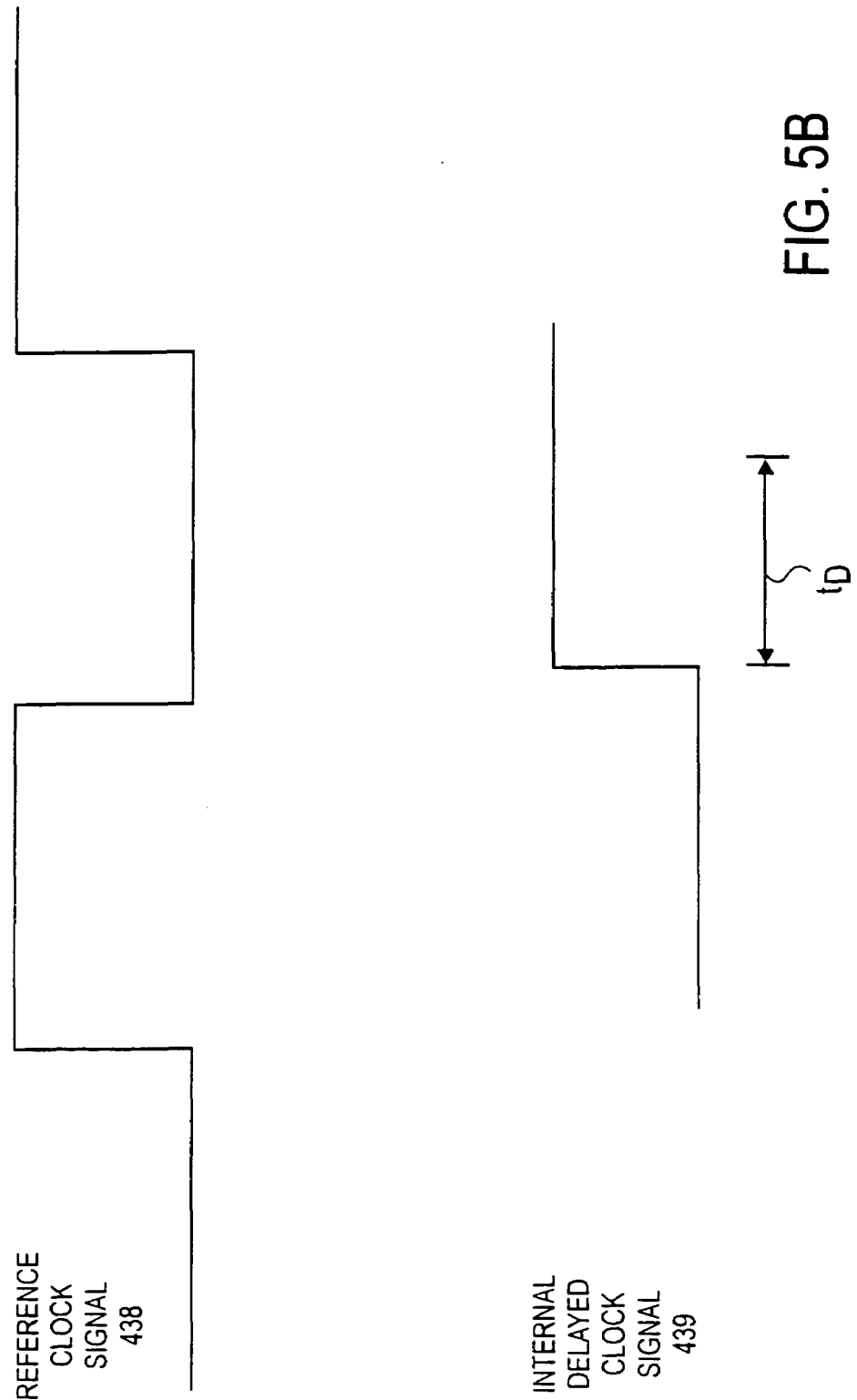
FIG. 5B is a timing diagram illustrating the relationship between a reference clock signal and a internal delayed clock signal.

The resulting internal clock signal 439 is phase shifted from reference clock signal 438 such that both clock signals have the same frequency but the triggering edges of the internal clock signal 439 are delayed with respect to the triggering edges of the reference clock signal 438, as illustrated in FIG. 5B. The internal clock signal 439 can then be used to clock one of the output registers in a sufficient amount, for example, to satisfy the set up time of a follow device that is clocked by reference clock signal 438 and receives a signal from one of the output registers.

For another embodiment, multiplexer 550 may be replaced with a 1-to-$2^n$ demultiplexer that receives the reference clock signal 438 and, in response to decoder 555, selects one of the delay paths 571–579 to provide the internal clock 439 to the input of output register 425.

Similar to that mentioned with respect to programmable delay circuit 415 of FIG. 4, programmable delay circuit 515 may be particularly useful in a CAM device that may be noisier than other types of memory devices due to the simultaneous comparing of data with many CAM cells in a CAM array. Such a compare operation generates a large amount of current switching that would have less of an adverse affect on programmable delay circuit 515 than on a PLL/DLL if they were operated with the same power supply as used to power a CAM array. In addition, a lower voltage power supply may be used to power programmable delay circuit 515 than may otherwise be needed to power a PLL or DLL, and the voltage power supply for programmable delay circuit 415 may scale with that of other circuits, such as the CAM array, as fabrication processes scale to smaller and smaller geometries. Furthermore, programmable delay circuit 515 is not limited to a particular operating frequency range, thus increasing the applications in which programmable delay circuit 515 may be used.

In one embodiment, programmable register 560 may be pre-programmed by a user (e.g., a line card manufacturer, router manufacturer, end customer) to select delay path 571 or a particular delay element 571–579 prior to operation of the device in its designated system. Programmable register 560 may be accessible to the user for programming through one or more input/output (I/O) pins (not shown) of the packaged CAM device. The user may establish a connection to the register through such programming I/O pins and thereby program the register through hardware or software means.

A particular delay element may be selected based upon an anticipated clock skew for a particular integrated circuit. The clock skew for an integrated circuit operating at a particular frequency, or frequency range, may be anticipated based on, for examples, calculations, simulations, empirical data from prototypes units, and the like.

FIG. 8 is an exemplary table of the programming values for selecting a particular delay element based on the frequency (or a range of frequencies) of a reference clock signal. In one embodiment, for example, it may be determined that a particular CAM integrated circuit design operating at 200 MHz is anticipated to have a clock skew of 4.5 ns. As such, one of the delay elements (e.g., delay element 579 of FIG. 5) may be designed to provide a 3 ns delay. Where, for example, a 4 bit register is used, a user may program programmable register 560 of FIG. 5 with a 0000 binary pattern which, when decoded by decoder 555 of FIG. 5, causes multiplexer 550 of FIG. 5 to select the internal clock signal generated by delay element 579.

Figure 9:
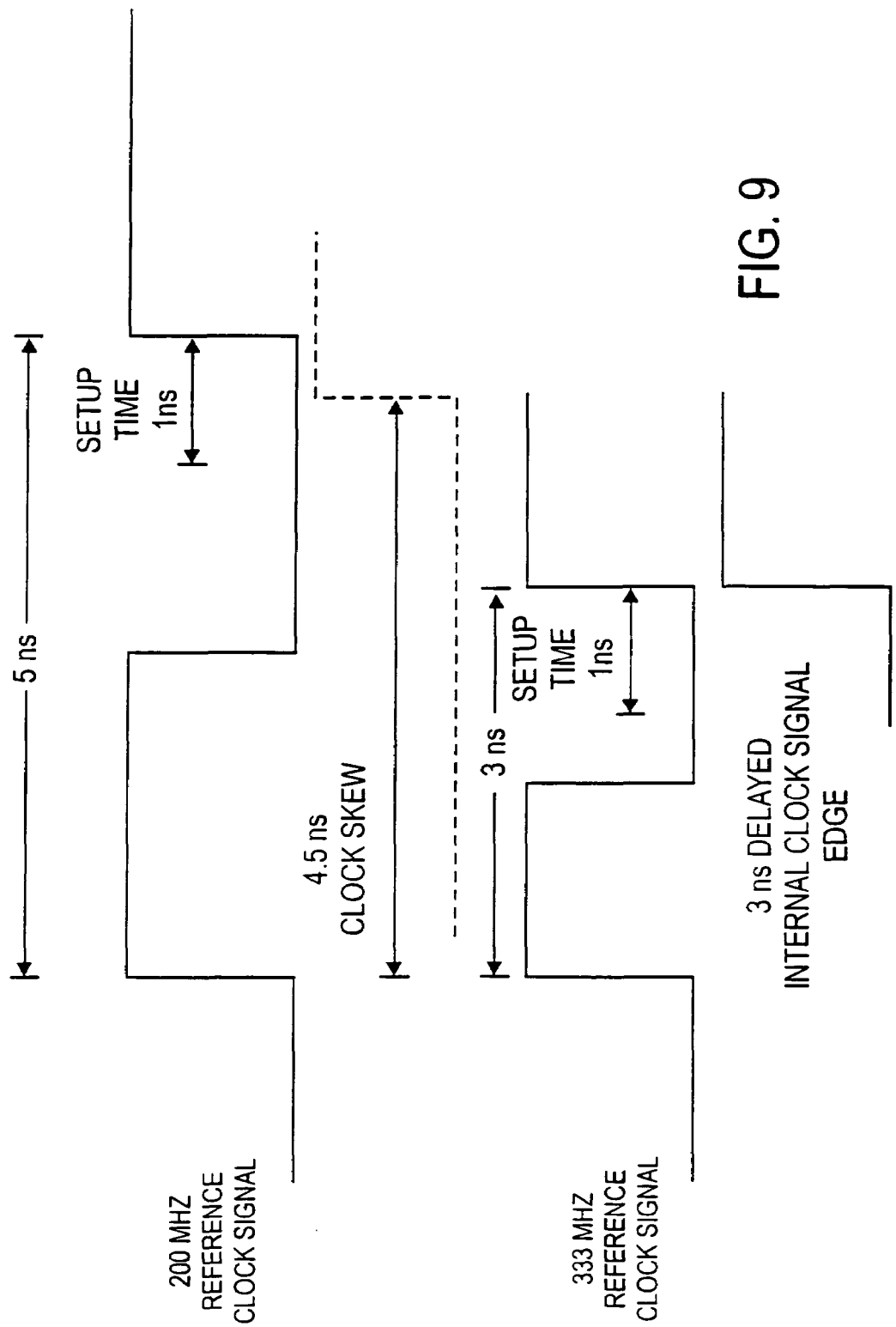
FIG. 9 is an exemplary illustration of the delayed internal clock signal requirement over different frequencies of the reference clock signal.

In one embodiment, the programmable delay circuit 515 may be programmed, or reprogrammed, to select a different delayed clock signal to accommodate a different frequency of operating the reference clock signal. For example, if the reference clock signal is desired to be run at 200 MHz (i.e., 5 ns cycle) and the clock skew and setup time, for a follow on device, are anticipated to be 4.5 ns and 0.5 ns, respectively, then a 3 ns delay path could be selected to satisfy the setup time of the follow on device, as illustrated by FIG. 9. Correspondingly, programmable delay circuit 515 may be programmed to provide a 3 ns delay for the internal clock signal. If the same integrated circuit were then used with a reference clock signal running at 333 MHz (i.e., an 3 ns cycle) then (with the same assumptions of clock skew and setup time), a 3 ns delay would generate an internal clock signal with a trigger edge beyond that of the 3 ns cycle, which would not allow for sufficient setup time for a follow on device to use a succeeding clock edge of the CLK. A user could program, or reprogram, the programmable register 560 to select, continuing the previous example, a 2 ns delay for the internal clock signal if the reference clock was to be run at 333 MHz. In this manner, the appropriate clock signal input to data output skew may be generated across various frequencies of the reference clock signal.

The selection of a particular time period of delay for a given frequency provides an advantage over prior art delay methods using a PLL/DLL. As previously discussed, the internal clock signal generated by a PLL/DLL has a fixed amount of delay with respect to the reference clock signal and the phase shift of the internal clock signal is locked to the frequency of the reference clock signal. Although, the fixed amount of delay may be adjusted, such adjustment may only be made as a discrete percentage of the total maximum allowable delay, thereby limiting the versatility of PLL/DLL.

Figure 6:
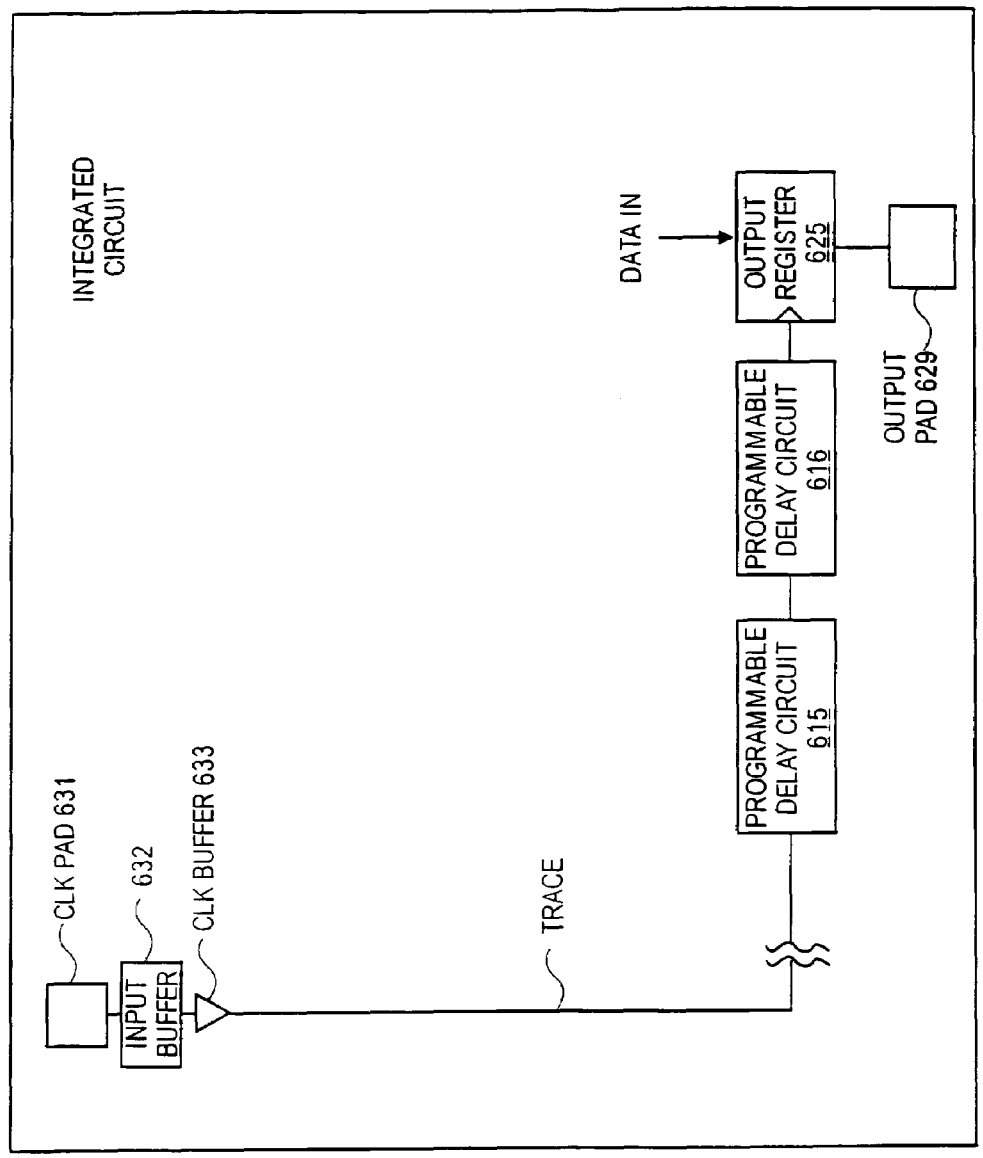
FIG. 6 illustrates an alternative embodiment of an integrated circuit having multiple programmable delay circuits.

FIG. 6 illustrates another embodiment of an integrated circuit having multiple programmable delay circuits. Integrated circuit 620 may be CAM device 420 and programmable delay circuit 615 may be the programmable delay circuit 415 of FIG. 4. Integrated circuit 620 may include multiple programmable delay circuits to refine the selection of an internal clock signal having a desired delay with respect to a reference clock signal. In the illustrated embodiment of FIG. 6, for example, integrated circuit 620 may have a first programmable delay circuit 615 and a second programmable delay circuit 616 coupled between the clock input pad 631 and output register 625. The second programmable delay circuitry 616 may be used to fine tune the desired delay for factors that may vary the anticipated clock skew for a given frequency, for examples, process and temperature variations. The second programmable delay circuitry 616 may also be used to reduce the total number of delay elements needed by using combinations of delay elements rather than a separate delay element for each delay path.

In one embodiment, each of programmable delay circuits 615 and 616 may be similar to programmable delay circuit 515 of FIG. 5A. In such an embodiment, second programmable delay circuit 616 includes its own programmable register to receive the fine tuning time period information to select among the various delay elements in delay circuit 616. Alternatively, programmable delay circuits 615 and 616 may share a common programmable register with different bit positions of the common programmable register coupled to respective decoders in programmable delay circuits 615 and 616.

The use of programmable delay circuits as discussed above may enable integrated circuits and, in particular, CAM devices to operate at higher frequencies than would otherwise be possible. By using a programmable register to select from among clock signals that are phase shifted by delay elements, a delayed internal clock signal, relative to a reference clock signal, may be generated without the use of feedback circuit as with prior art solutions. This may provide for the generation of a more precise delayed internal clock signal across various frequencies of operation of the reference clock signal.

The programmable delay circuits discussed herein may be particularly useful in CAM devices (e.g., CAM device 420) that may typically be more noisy than other types of memory devices (e.g., a SRAM). For example, during a compare operation, the entire CAM array 402 is active, thereby generating a large amount of current switching that would have an adverse effect on PLL and DLL if they were operated on the same power supplies as CAM array 402. The programmable delay circuits discussed herein may advantageously be operated with the same power supplies as the other digital components of the CAM device.

One or more of the programmable delay circuits discussed above may also be used to clock other circuits in a CAM device including, for example, any of the circuits shown in CAM device 420 of FIG. 4.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. An apparatus, comprising:
a content addressable memory (CAM) array;
an output register coupled to the CAM array, the output register configured to output data based on a delayed clock signal;
a programmable delay circuit coupled to receive a reference clock signal and generate the delayed clock signal using a delay element;
a second programmable delay circuit coupled between the programmable delay circuit and the output register;
wherein the reference clock signal is received at a clock pad and wherein the programmable delay circuit is coupled between the clock pad and the output register; and
wherein the programmable delay circuit and the second programmable delay circuit each comprises a separate programmable register.

2. The apparatus of claim 1, wherein the programmable delay circuit comprises:
a plurality of the delay elements to generate a plurality of delayed clock signals;
a programmable register to store information indicating a particular delayed clock signal of the plurality of delayed clock signals; and
a multiplexer coupled with the programmable register and the plurality of delay elements to select the particular delayed clock signal based on the information.

3. The apparatus of claim 2, wherein the programmable delay circuit further comprises a decoder coupled to the programmable register to decode the information stored in the programmable register.

4. The apparatus of claim 2, wherein each of the plurality of delay elements provides a different time period of delay to the reference clock signal.

5. The apparatus of claim 4, wherein one of the plurality of delay elements provides substantially a zero time period of delay.

6. The apparatus of claim 4, wherein at least one of the plurality of delay elements comprises a series of inverters.

7. The apparatus of claim 1, further comprising an instruction decoder coupled to the clock pad to receive the reference clock signal.

8. The apparatus of claim 2, wherein the information for the programmable register indicates the particular delayed clock signal according to a frequency of the reference clock signal.

9. The apparatus of claim 1, wherein the programmable delay circuit is a first programmable delay circuit comprising:
a first plurality of the delay elements to generate a first plurality of delayed clock signals;
a first programmable register to store first information indicating a first particular delayed clock signal of the first plurality of delayed clock signals; and
a first multiplexer coupled with the first programmable register and the first plurality of delay elements to select the first particular delayed clock signal based on the first information.

10. The apparatus of claim 9, wherein the second programmable delay circuit comprises:
a second plurality of the delay elements to receive the first particular delayed clock signal and generate a second plurality of delayed clock signals, and wherein the second programmable register is to store second information indicating a second particular delayed clock signal of the second plurality of delayed clock signals; and
a second multiplexer coupled with the second programmable register and the second plurality of delay elements to select the second particular delayed clock signal based on the second information.

11. The apparatus of claim 1, further comprising a processor coupled to the clock pad to transmit the reference clock signal.

12. The apparatus of claim 1, further comprising a processor coupled with the output register to receive the data.

13. The apparatus of claim 1, further comprising a read circuit coupled between the CAM array and the output register.

14. The apparatus of claim 1, wherein the CAM array comprises a plurality of rows of CAM cells each having a corresponding match line.

15. The apparatus of claim 14, further comprising a match flag circuit coupled to the match lines and the output register.

16. The apparatus of claim 14, further comprising an encoder circuit coupled to the match lines and the output register.

17. An apparatus, comprising:
a content addressable memory (CAM) array;
an output register coupled to the CAM array, the output register configured to output data based on a delayed clock signal;
a first programmable delay circuit coupled to receive a reference clock signal and generate the delayed clock signal using a delay element; and
a second programmable delay circuit coupled with the first programmable delay circuit;
wherein the first programmable delay circuit includes:
  a first plurality of the delay elements to generate a first plurality of delayed clock signals,
  a first programmable register to store first information indicating a first particular delayed clock signal of the first plurality of delayed clock signals, and
  a first multiplexer coupled with the first programmable register and the first plurality of delay elements to select the fist particular delay clock signal based on the first information; and
wherein the second programmable delay circuit includes:
  a second plurality of the delay elements to receive the first particular delayed clock signal and generate a second plurality of delayed clock signals,
  a second programmable register to stored second information indicating a second particular delayed clock signal of the second plurality of delayed clock signals, and
  a second multiplexer coupled with the second programmable register and the second plurality of delay elements to select the second particular delayed clock signal based on the second information.

18. An apparatus, comprising:
a content addressable memory (CAM) array;
an output register coupled to the CAM array, the output register configured to output data based on a delayed clock signal;
a first programmable delay circuit coupled to receive a reference clock signal and generate the delayed clock signal using a delay element; and
a second programmable delay circuit coupled with the first programmable delay circuit;
wherein the first programmable delay circuit includes:
  a first plurality of the delay elements to generate a first plurality of delayed clock signals,
  a first programmable register to store first information indicating a first particular delayed clock signal of the first plurality of delayed clock signals, and
  a first multiplexer coupled with the first programmable register and the first plurality of delay elements to select the fist particular delay clock signal based on the first information; and
wherein the second programmable delay circuit includes:
  a second plurality of the delay elements to receive the first particular delayed clock signal and generate a second plurality of delayed clock signals, the first programmable register for storing second information indicating a second particular delayed clock signal of the second plurality of delayed clock signals; and
  a second multiplexer coupled with the first programmable register and the second plurality of delay elements to select the second particular delayed clock signal based on the second information.

* * * * *

UNITED STATES PATENT AND TRADEMARK OFFICE
CERTIFICATE OF CORRECTION

PATENT NO. : 6,944,040 B1
APPLICATION NO. : 10/938028
DATED : September 13, 2005
INVENTOR(S) : Sandeep Khanna It is certified that error appears in the above-identified patent and that said Letters Patent is hereby corrected as shown below:

In the claims:
Claim 17, Column 13, line 32, replace "fist" with --first--.
Claim 17, Column 13, line 38, replace "stored" with --store--.
Claim 18, Column 14, line 25, replace "fist" with --first--.

Signed and Sealed this

Fifth Day of September, 2006

JON W. DUDAS
*Director of the United States Patent and Trademark Office*